United States Patent [19]
McCandless

[11] Patent Number: 5,663,683
[45] Date of Patent: Sep. 2, 1997

[54] MIST COOLED DISTRIBUTED AMPLIFIER UTILIZING A CONNECTORLESS MODULE

[75] Inventor: Jay H. McCandless, Issaquah, Wash.

[73] Assignee: The Boeing Company, Seattle, Wash.

[21] Appl. No.: 574,008

[22] Filed: Dec. 18, 1995

Related U.S. Application Data

[63] Continuation-in-part of Ser. No. 326,105, Oct. 19, 1994, abandoned.

[51] Int. Cl.$^6$ ............................................ H03F 3/68
[52] U.S. Cl. ............................... 330/286; 330/65
[58] Field of Search ........................ 330/56, 65, 66, 330/124 R, 286, 289, 295; 343/700 MS, 853

[56] References Cited

U.S. PATENT DOCUMENTS

| | | |
|---|---|---|
| 4,283,685 | 8/1981 | MacMaster et al. . |
| 4,939,527 | 7/1990 | Lamberty et al. . |
| 5,099,254 | 3/1992 | Tsukii ................................. 343/853 |
| 5,140,335 | 8/1992 | Staehlin et al. . |
| 5,214,394 | 5/1993 | Wong . |
| 5,276,455 | 1/1994 | Fitzsimmons et al. . |
| 5,327,152 | 7/1994 | Kruger et al. . |

OTHER PUBLICATIONS

George W. Fitzsimmons et al. "A Connectorless Module for an EHF Phased–Array Antenna", Jan. 1994, pp. 114–126, Microwave Journal.

*Primary Examiner*—James B. Mullins
*Attorney, Agent, or Firm*—Conrad O. Gardner

[57] ABSTRACT

A mist cooled distributed amplifier utilizing a connectorless module. The amplifier comprises modules that are connected to waveguides in a honeycomb. The RF signals are distributed to and combined from the modules using a distributed waveguide manifold. Cooling is accomplished by forming channels between the modules through which mist is transmitted and collected and condensed at the output end.

2 Claims, 4 Drawing Sheets

Fig. 2.
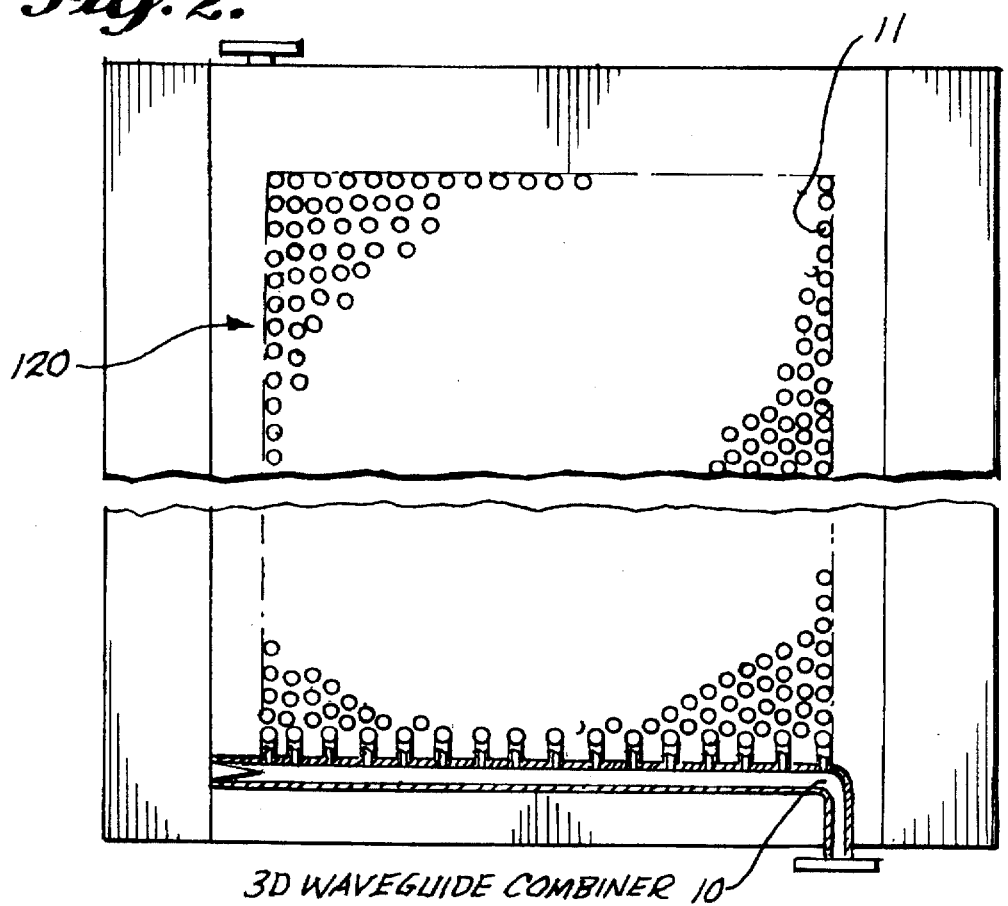
3D WAVEGUIDE COMBINER 10
NOZZLE 12
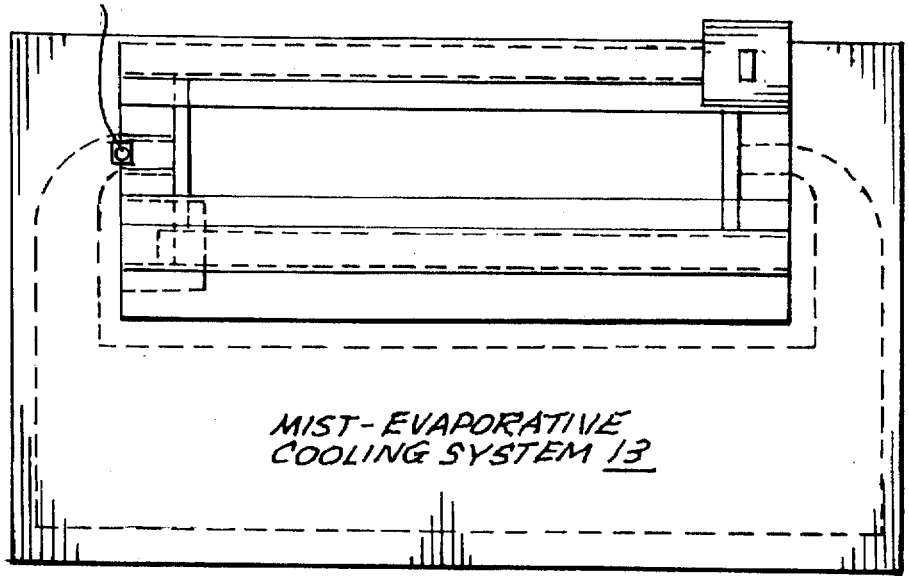
MIST-EVAPORATIVE COOLING SYSTEM 13
Fig. 3.

MIST COOLED DISTRIBUTED AMPLIFIER UTILIZING A CONNECTORLESS MODULE

RELATED APPLICATIONS

This application is a continuation-in-part of U.S. patent application Ser. No. 08/326,105 filed Oct. 19, 1994, now abandoned.

FIELD OF THE INVENTION

This invention relates to distributed amplifiers and more particularly to a phased array antenna utilized as a microwave distributed amplifier with integral cooling for increased power output.

BACKGROUND OF THE INVENTION

Problem to be Solved

For many communications and radar applications a high power electromagnetic signal amplifier is required before transmission. At microwave frequencies the amplifier has traditionally been a traveling wave tube amplifier (TWTA). For various reasons such as reliability and biasing it is desirable to use a solid state power amplifier (SSPA) instead. To date, the SSPA's built using a single device have been limited to a few watts at Ku band, and fractions of a watt at K band and above. To get the desired tens or hundreds of watts it is necessary to combine the outputs of many individual amplifiers. The problem to be solved is how to do the power combining.

PRIOR ATTEMPTS

The previous solutions can be broken into 3 categories. The first is where the outputs of multiple devices are combined in a single package such as a multi-chip module. The second is where a single amplifier is packaged, typically hermetically, and then multiple packages are combined. The packages will often have a coax or waveguide connector. And the third is a hybrid approach where multiple devices are combined in a hermetic package and then multiple packages are combined using a stripline or waveguide combiner. There are many forms of both.

As higher levels of combining are desired these techniques run into problems. To minimize losses in the combiner it is desirable to keep the transmission lines as short as possible. But at high frequencies the connectors become relatively large and force an inefficient spread out combiner so that eventually increasing the number of amplifiers does not increase the output power.

Even if an efficient large scale combiner could be built there are other issues such as cost and yields which are related. As more and more devices are combined, more and more bias connections are required. These multiple connections dramatically lower the yield and increase the cost of fabrication.

A third major issue is heat dissipation. If the amplifiers are close together to lower the combiner losses then they concentrate the heat dissipated from the individual amplifier. This heat must be dissipated to a heat sink without a large temperature delta or the junction temperature of the active device will be high and shorten the amplifier lifetime.

The patent literature includes U.S. Pat. No. 5,327,152 to Kruger et al.; U.S. Pat. No. 5,214,394 to Wong and U.S. Pat. No. 5,140,335 to Staehlin et al. Kruger et al. and Wong et al. are similar regarding the combining of microwave signals generated from a planar MMIC (miniature microwave integrated circuit) module arrays. Kruger and Staehlin are similar regarding the use of microwave apparatus with integral cooling networks to control generated thermal excesses.

Kruger et al. relates a phased array antenna comprising a modular structure with integral cooling media passages. Kruger discusses: 1) a planar MMIC phased array with integral cooling, and 2) increased modularity of antenna components for improved assembly/disassembly. Kruger describes a phased array antenna, in contrast to the present microwave amplifier/combiner, 2) uses heat conductive spines to route heat from active components to cooled areas of the structure (Col 6, ln 59), 3) teaches an assembly that is complicated to assemble and maintain (i.e. uses a complicated coaxial interconnect structure to couple each MMIC to their corresponding radiator (Col 6, ln 9) as opposed to the hereinafter disclosed connectorless module), 4) does not utilize the advantages of "mist-evaporative" cooling over liquids.

Wong uses a bi-directional horn to spatially combine planar MMIC module arrays. The bi-directionality allows one side of the MMIC planar array to be accessible for power, control and heat sink connections. Wong teaches the use of a waveguide to realize a microwave power amplifier/combiner. However, unlike the present system 1) Wong's waveguide is heavier, bulkier, and bi-directional (in contrast to the present unidirectional waveguide), 2) Wong dissipates heat using a heat sink (as opposed to the hereinafter disclosed integral cooling media channels).

Staehlin describes a liquid cooled, microwave combiner/manifold, who's physical geometry is such that tight Phase Control Module (PCM) spacing may be realized. Staehlin 1) combines microwave signals generated from MMIC planar arrays, 2) and utilizes liquid cooling to increase planar array scale and PCM/MMIC densities. However, in contrast to the present system, Staehlin: 1) teaches a waveguide manifold structure for a phased array antenna in contrast to the presently disclosed microwave power amplifier/combiner), and 2) describes the waveguide combiner/manifold as a component and suggests methods of integration (in contrast to the present disclosed modular, liquid cooled, connectorless assembly), 3) does not address the interface means for attaching MMIC/PCM active modules to the combiner/manifold (in contrast to the presently disclosed connectorless module).

MacMaster U.S. Pat. No. 4,283,685 et al., relates to a radial microwave power amplifier/combiners. MacMaster teaches the combining/amplification of MMIC/PCM generated microwave signals. However, in contrast to the present system, MacMaster 1) combines MMIC/PCM signals from a radial "squirrel cage" array structure (as opposed to the presently disclosed planar array), and 2) uses heat sinks for thermal control (as opposed to the hereinafter disclosed integral cooling media passages).

SUMMARY OF THE INVENTION

A liquid cooled, large scale microwave amplifier combiner in the nature of a phased-array antenna structure whose radiating antenna has attached a receiving waveguide to combine the microwave signals. Cooling is accomplished by forming the phased-array honeycomb cells in coolant channels which form a closed loop cooling system. Dielectric mists or fluids are sprayed or circulated down the channels, cooling the monolithic microwave integrated circuits MMIC that reside in the cells.

BRIEF DESCRIPTION OF THE FIGURES

FIG. 2 is illustrative of the system of FIG. 1 showing in detail the utilization therewith of mist evaporative cooling;

FIG. 3 is illustrative of the coolant portion of the system of FIG. 2;

DETAILED DESCRIPTION OF THE INVENTION SYSTEM CONCEPT

As hereinafter described in detail, those skilled in the art will recognize that the present system efficiently combines thousands of high yield hermetic modules into a large scale amplifier combiner.

METHOD OF ASSEMBLY

In the present combined amplifier, modules are placed in a module honeycomb. The Vcc connections are made with elastomeric connectors on each end of the module with the bias coming in on 2 perpendicular multi-layer wiring boards. The RF goes in and out of the package though hermetic end fire transitions into waveguide. The connections are held in place with waveguide honeycombs that bolt on each end of the module honeycomb. The RF is distributed to and combined from the modules using a distributed waveguide manifold, described in detail in U.S. Pat. No. 5,276,455 issued Jan. 4, 1994 and assigned to the Boeing Company. Typically similar structural configurations are shown e.g. in U.S. Pat. No. 4,939,527 issued Jul. 3, 1990 and assigned to the Boeing Company. See also a Connectorless Module for an EHF phased array antenna by George W. Fitzsimmons et al. in Microwave Journal, pages 114–126, January 1994.

SYSTEM DESCRIPTION

Figure 1:
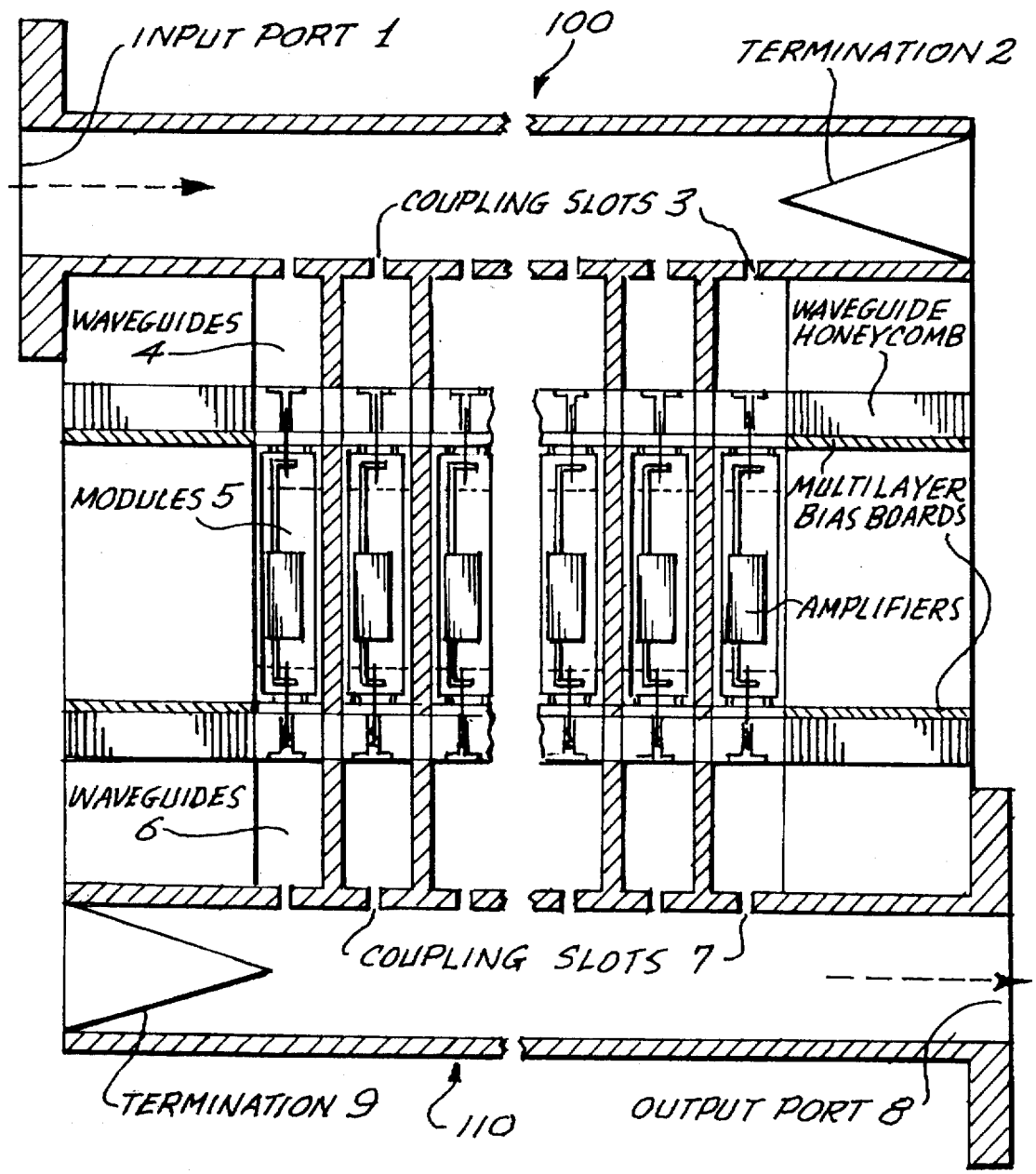
FIG. 1 is a system diagram of the present mist cooled distributed amplifier utilizing a connectorless module.

Turning now to FIG. 1 a waveguide bar 100 with an input on one end 1 and a termination 2 on the other end is seen. Approximately every half wavelength there is a slot 3 in the wall of the waveguide 100 and each slot 3 feeds a perpendicular waveguide 4. This row of waveguides feed a row of modules 5 which in turn feed another row of waveguides 6 which in turn feed slots 7 in combiner waveguide 110. Combiner waveguide 110 has output 8 and termination 9 reversed to form the basic distributed amplifier. These basic distributed amplifiers can then be considered the modules in a next level up distributed amplifier 120 as shown in FIG. 2, forming a 3D honeycomb structure with a 2 level waveguide manifold 10 on each end.

Cooling is accomplished by forming channels between the modules in module honeycomb 11 as shown in FIG. 2. The channel size must be small at MMW (millimeter wavelengths) frequencies where the element to element spacing is small. Mist is sprayed down the channel with a nozzle 12, picks up heat by evaporation, and then is collected and condensed at the other end 13. Mist can be sprayed down channels as narrow as 0.030" high. The present system has potential capabilities for generating up to 500 watts at 35 GHz and up to 60 watts at 95 GHz.

Figure 4A:
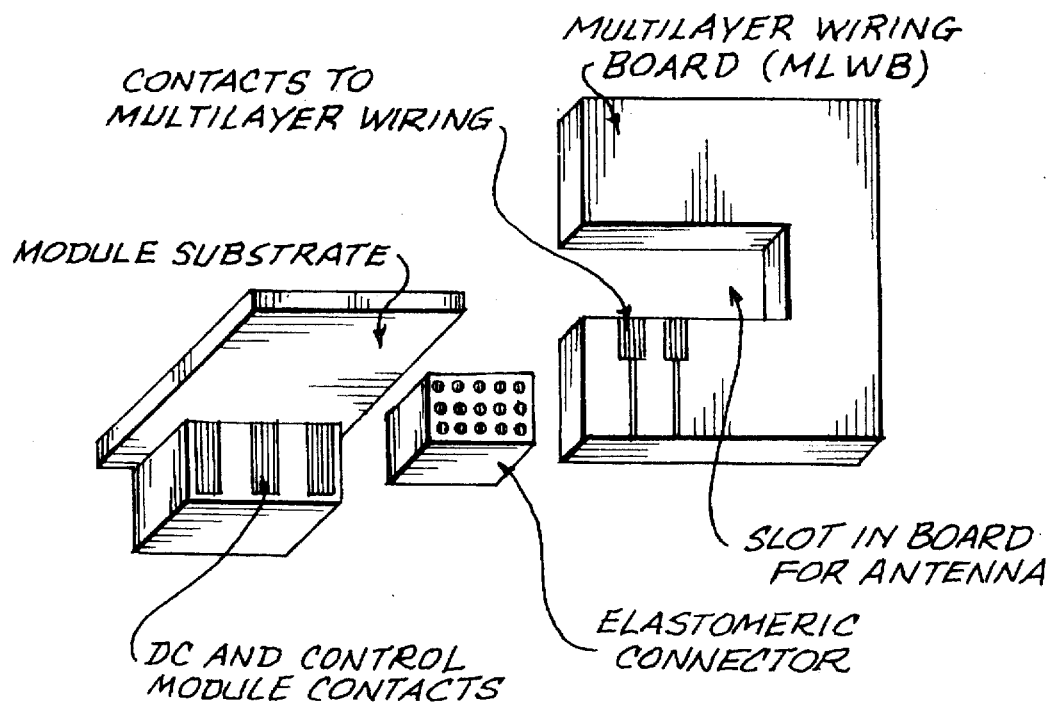
FIG. 4a is an exploded view of the module to MLWB DC connection using an elastomeric connectors.
Figure 4B:
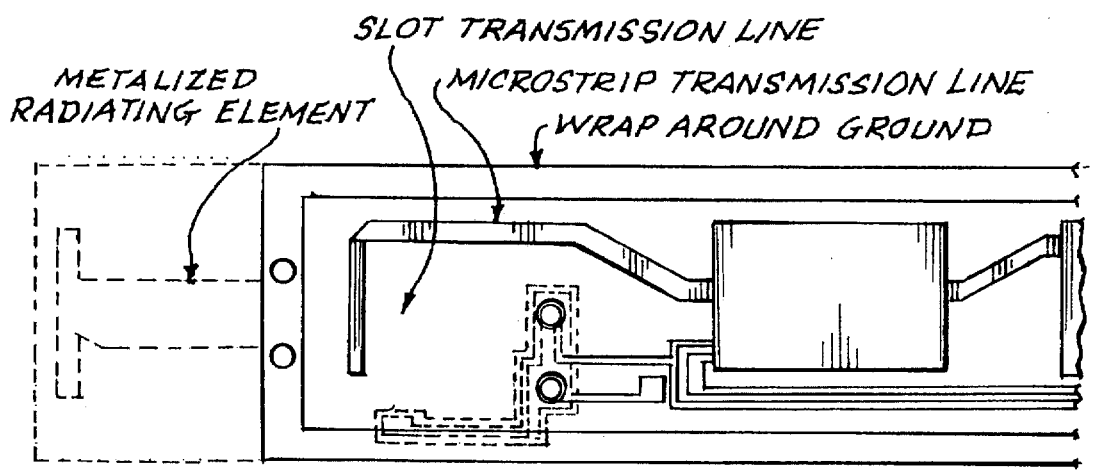
FIG. 4b is a top view of an open module.

FIG. 4b shows a top down view of an open module. The amplifier chip has symmetrical RF input and output transmission lines. The micorstrip lines are transitioned to slot transmissions lines on the bottom of the package. In the process of transitioning to slot line the RF signal are carried in and out of the module under a hermetic seal ring. The slot transmission line feeds a dipole that launches a wave into the input and output waveguides. After the amplifier chip is assembled into the package a metal lid is hermetically attached to the seal ring, forming a hermetic enclosure for the amplifier chip.

The bias and any required control signals are brought into the module by edge contacts on the module carrier. The DC and control is carried inside the package by hermetic metal vias, and then routed to the amplifier chip by traces. The connection between the DC contacts on the module carrier and the MLWB is made by an elastomeric connector that is held in a pocket defined by the ceramic substrate, the module carrier and the cut out in the module honeycomb. An elastomeric for each module is dropped into the pocket during assembly. The MLWB is placed on the module honeycomb and then the pressure plate and waveguide honeycomb are bolted on. The MLWB compresses the elastomerics and thus makes the connection between the module and the MLWB by embedded wires in the elastomeric.

Figure 5:
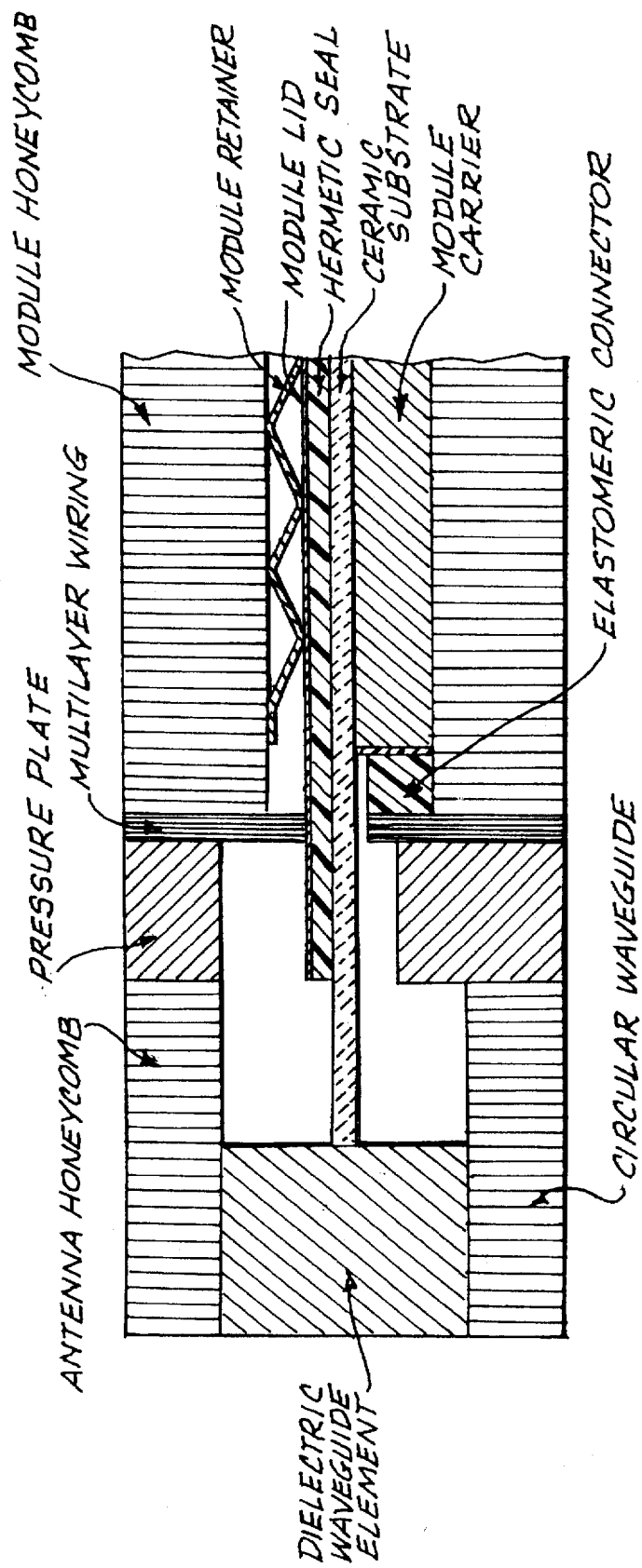
FIG. 5 is a side cross sectional view of the module of FIG. 4 subsequent to assembly into the distributed amplifier.

FIG. 5 shows a side cross sectional view on the module after it has been assembled into the distributed amplifier. The compressed elastomeric is shown in its pocket. The ceramic substrate is shown extending into the waveguide, butting against the dielectric waveguide element. The module is held in the module honeycomb with a module retainer. The retainer keeps the module from rattling and also assures good thermal contact between the module carrier and the module honeycomb.

The present system concept includes configurations where the power dissipated is sufficiently low such that conduction to a heat sink would be adequate and therefore the mist-evaporative cooling apparatus would not be required. Those skilled in the art will further recognize different ways to implement a hermetic transition in and out of the package, as well as other types of combiners such as stripline, frequency permitting.

What is claimed is:

1. A microwave power amplifier comprising in combination: a plurality of phased array honeycomb amplifier cells; said plurality of phased array honeycomb amplifier cells having a plurality of integral coolant channels forming a closed loop cooling system; a distributed waveguide manifold for coupling radio frequency signals to said plurality of phased array honeycomb amplifier cells; and, a distributed waveguide manifold coupled to said plurality of phased array honeycomb amplifier cells for combining amplified radio frequency signals from said plurality of phased array honeycomb amplifier cells; and wherein said plurality of phased array honeycomb amplifier cells are mechanically DC connected to a DC power distribution board utilizing compressive mechanical means comprising an elastomeric connector, and where the RF signal is capacitively coupled in and out of the amplifier cells so that all RF and DC connections are made simultaneously with the mechanical assembly of the two distributed manifolds.

2. The microwave amplifier according to claim 1 wherein said elastomeric connector is held in a pocket by a ceramic substrate.

* * * * *